(12) United States Patent
Kurokawa (10) Patent No.: US 6,703,630 B2
(45) Date of Patent: Mar. 9, 2004

(54) EXPOSURE METHOD, ELECTRON BEAM EXPOSURE APPARATUS AND FABRICATION METHOD OF ELECTRONIC DEVICE

(75) Inventor: Masaki Kurokawa, Tokyo (JP)

(73) Assignee: Advantest Corporation, Tokyo (JP)

( * ) Notice: Subject to any disclaimer, the term of this patent is extended or adjusted under 35 U.S.C. 154(b) by 107 days.

(21) Appl. No.: 10/014,111

(22) Filed: Dec. 10, 2001

(65) Prior Publication Data

US 2003/0102443 A1 Jun. 5, 2003

(30) Foreign Application Priority Data

Dec. 4, 2001 (JP) ........................... 2001-370545
Dec. 10, 2001 (JP) ........................... 2001-376423

(51) Int. Cl.$^7$ ............................. G21K 5/10; H01J 37/08
(52) U.S. Cl. ........................... 250/492.22; 250/492.23
(58) Field of Search .................. 250/492.22, 492.23

(56) References Cited

U.S. PATENT DOCUMENTS 5,075,623 A * 12/1991 Matsuda et al. ............ 324/250

* cited by examiner

*Primary Examiner*—John R. Lee
*Assistant Examiner*—Erin-Michael Gill
(74) *Attorney, Agent, or Firm*—Morrison & Foerster LLP (57) ABSTRACT

An exposure method for exposing a wafer having magnetic material by using an electron beam, includes: placing the wafer on a wafer stage; calculating a correction value that corrects a deflection amount by a deflector that deflects the electron beam, based on an irradiation position on the wafer, on which the electron beam is to be incident, and a magnetic field formed by the magnetic material; and deflecting the electron beam based on the correction value to expose the wafer.

17 Claims, 4 Drawing Sheets

EXPOSURE METHOD, ELECTRON BEAM EXPOSURE APPARATUS AND FABRICATION METHOD OF ELECTRONIC DEVICE

This patent application claims priority on a Japanese patent application, 2001-370545 filed on Dec. 4, 2001, and Japanese patent application, 2001-376423 filed on Dec. 10, 2001, the contents of which are incorporated herein by reference.

BACKGROUND OF THE INVENTION

1. Field of the Invention

The present invention relates to an exposure method, an electron beam exposure apparatus and a fabrication method of an electronic device. More particularly, the present invention relates to an exposure method for exposing a wafer with high precision while correcting a position irradiated with an electron beam.

2. Description of the Related Art

An electron beam exposure apparatus has an electromagnetic lens that can converge an electron beam by using a magnetic field. By using the electromagnetic lens, the electron beam exposure apparatus adjusts a focus of the electron beam with respect to a wafer, thereby adjusting an irradiation position where the wafer is irradiated with the electron beam to a predetermined position.

In recent years, demand for an electron beam exposure apparatus that can expose a wafer having magnetic material with high precision has increased with the increase of finer electronic devices having parts formed of magnetic material such as a magnetic head and an MRAM.

In the conventional electron beam exposure apparatus, however, the irradiation position of the wafer which is irradiated with the electron beam is shifted from a desired position, because the conventional electron beam exposure apparatus adjusts the focus of the electron beam with respect to the wafer by using the electromagnetic lens the magnetic field of which is influenced by the magnetic material of the wafer in a case of exposing the wafer with the magnetic material.

SUMMARY OF THE INVENTION

Therefore, it is an object of the present invention to provide an exposure method, an electron beam exposure apparatus and a fabrication method of an electronic device, which are capable of overcoming the above drawbacks accompanying the conventional art. The above and other objects can be achieved by combinations described in the independent claims. The dependent claims define further advantageous and exemplary combinations of the present invention.

According to the first aspect of the present invention, an exposure method for exposing a wafer having magnetic material by using an electron beam, comprises: placing the wafer on a wafer stage; calculating a correction value that corrects a deflection amount by a deflector that deflects the electron beam, based on an irradiation position on the wafer on which the electron beam is to be incident and a magnetic field formed by the magnetic material; and deflecting the electron beam based on the correction value to expose the wafer.

The calculation may calculate the correction value further based on a distribution of the magnetic material on or in the wafer.

The calculation may calculate the correction value further based on a wafer-placed position on the wafer stage at which the wafer is placed.

The calculation may calculate the correction value further based on a positional relationship between the wafer and a magnetic field formed by an electromagnetic lens for converging the electron beam.

The calculation may calculate the correction value based on the positional relationship between the wafer and the electromagnetic lens serving as an objective lens.

The calculation may calculate the correction value further based on a shape of the wafer.

The exposure method may further comprise correcting a stage-position that is a position of the wafer stage, and the calculation may calculate the correction value based on the irradiation position on the wafer placed on the wafer stage for which the stage-position has been corrected.

The exposure method may further comprise forming a mark portion on the wafer, and the calculation may calculate the correction value further based on a positional relationship between a position of the mark portion and the irradiation position on the wafer.

The exposure method may further comprise: placing another wafer on the wafer stage; correcting another correction value that corrects the deflection amount by the deflector based on a positional relationship between the wafer-placed position of the wafer on the wafer stage and another wafer-placed position of the other wafer on the wafer stage, and the correction value for the wafer; and deflecting the electron beam based on the other correction value to expose the other wafer.

According to the second aspect of the present invention, an exposure method for exposing a wafer by using an electron beam, comprises: placing the wafer on a wafer stage; calculating a correction value that corrects a deflection amount of the electron beam based on a positional relationship between the wafer and a magnetic field for converging the electron beam; and deflecting the electron beam based on the correction value to expose the wafer.

According to the third aspect of the present invention, an electron beam exposure apparatus for exposing a wafer having magnetic material by using an electron beam, comprises; a wafer stage on which the wafer is to be placed; a deflector operable to deflect the electron beam; and a calculation unit operable to calculate a correction value that corrects a deflection amount of the electron beam by the deflector, based on an irradiation position on the wafer, on which the electron beam is to be incident, and a magnetic field formed by the magnetic material.

The electron beam exposure apparatus may further comprise an electromagnetic lens operable to form a magnetic field to converge the electron beam, and the calculation unit may calculate the correction value further based on a positional relationship between the wafer and the magnetic field formed by the electromagnetic lens.

The electromagnetic lens may serve as an objective lens.

According to the fourth aspect of the present invention, a fabrication method of an electronic device by exposing a wafer having magnetic material by using an electromagnetic lens, comprises: placing the wafer on a wafer stage; calculating a correction value that corrects a deflection amount by a deflector for deflecting the electron beam, based on an irradiation position on the wafer, on which the electron beam is to be incident, and a magnetic field formed by the magnetic material; and deflecting the electron beam based on the correction value to expose the wafer.

The fabrication method of an electronic device may further comprise forming a mark portion including at least a first mark portion in a first region in the wafer, wherein the placing of the wafer places the wafer with the first mark portion therein on the wafer stage, and the calculation calculates the correction value further based on a position of the first mark portion in the wafer.

The fabrication method of an electronic device may further comprise: storing the correction value in the first region; placing other wafer having magnetic material on the wafer stage; and irradiating the first region in the wafer with the electron beam based on the stored correction value in the first region and a position of the other wafer on the wafer stage.

The formation of the mark portion includes: applying resist on the wafer; exposing the resist by irradiating the first region with light to form the first mark portion in the first region; and exposing the resist by irradiating a second region in the wafer with light to form a second mark portion in the second region, and the calculation may calculate the correction value in the first region further based on the position of the first region and calculates the correction value in the second region further based on a position of the second region, and, in the exposure of the wafer, the electron beam may be deflected based on the correction value in the first region in a case where the first region is irradiated with the electron beam, and may be deflected based on the correction value in the second region in a case where the second region is irradiated with the electron beam.

The formation of the mark portion may include forming a plurality of first mark portions in the first region and forming a plurality of second mark portions in the second region, and the calculation calculates the correction value in the first region further based on relative positions of the plurality of first mark portions and calculates the correction value in the second region further based on relative positions of the plurality of second mark portions.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiments are not necessarily essential to the invention.

Figure 1:
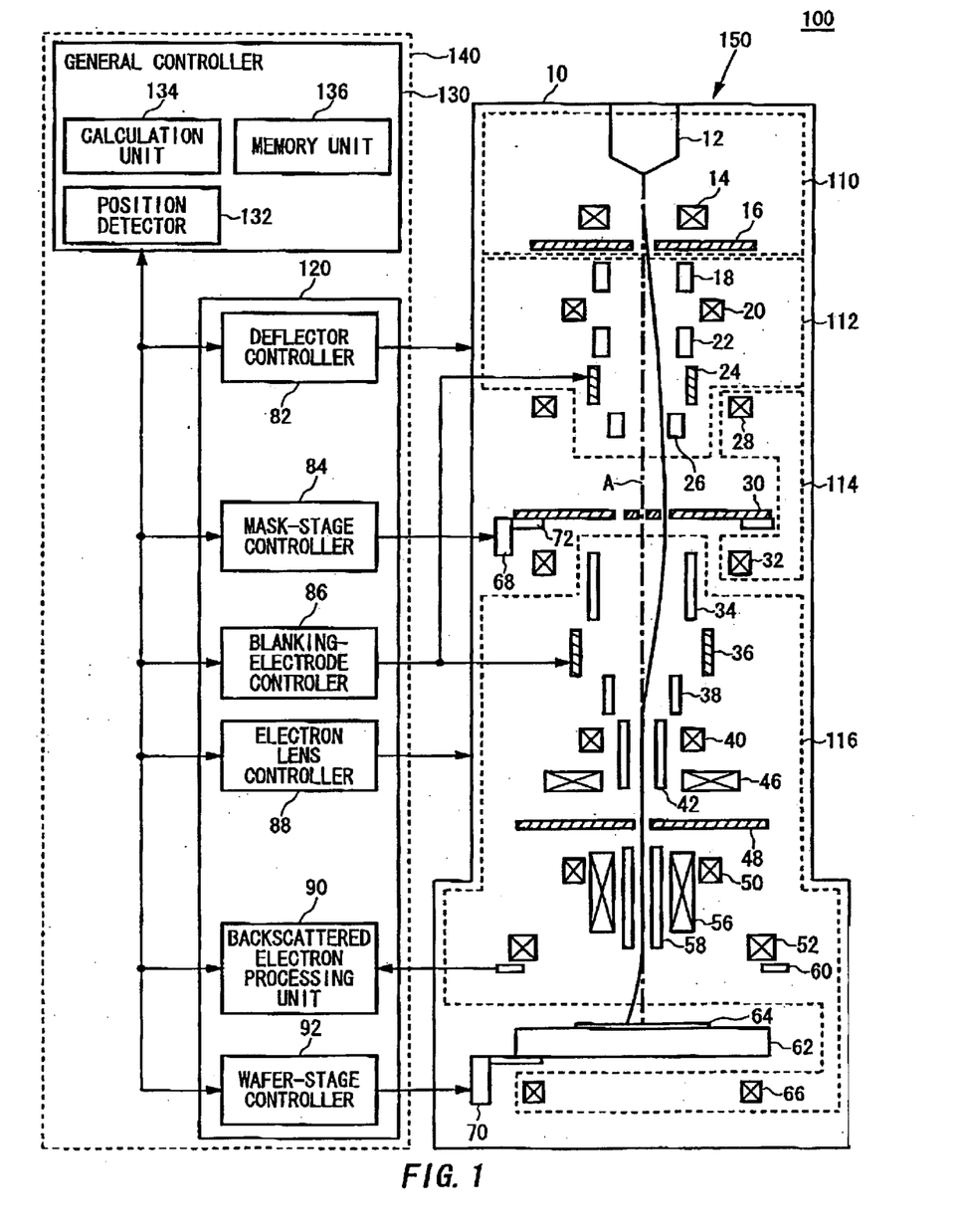
FIG. 1 shows an exemplary structure of an electron beam exposure apparatus according to an embodiment of the present invention.

FIG. 1 shows an exemplary structure of an electron beam exposure apparatus 100 according to an embodiment of the present invention. The electron beam exposure apparatus 100 includes an exposure unit 150 for performing a predetermined exposure operation using an electron beam for a wafer 64 and a controlling system 140 for controlling operations of respective parts of the exposure unit 150.

The exposure unit 150 has an electron optical system including: an electron beam irradiation system 110 for emitting a predetermined electron beam; a mask projection system 112 for deflecting the electron beam emitted from the electron beam irradiation system 110 and adjusting a focused position of the electron beam in the vicinity of a mask 30; a focus adjusting lens system 114 for adjusting focusing conditions of the electron beam which contain conditions before and after the electron beam passes through the mask 30; and a wafer projection system 116 for deflecting the electron beam which has passed through the mask 30 to be directed to a predetermined region of the wafer 64 placed on a wafer stage 62 and adjusting an orientation and a size of an image of a pattern to be transferred onto the wafer 64.

The exposure unit 150 also has a stage system including: a mask stage 72 onto which the mask 30 having a plurality of opening patterns is to be placed, the opening patterns being patterns to be transferred by exposure onto the wafer 64; a mask-stage driving unit 68 for driving the mask stage 72; the wafer stage 62 onto which the wafer 64 is to be placed; and a wafer-stage driving unit 70 for driving the wafer stage 62. The exposure unit 150 further has an electron detector 60 that detects electrons scattered from the side of the wafer stage 62 and then converts the amount of the scattered electrons to an electric signal having the magnitude corresponding to the amount of the scattered electrons.

The electron beam irradiation system 110 includes an electron gun 12 which generates the electron beam, a first electromagnetic lens 14 for determining the focus position of the electron beam, and a slit part 16 having rectangular openings which allow the electron beam to pass therethrough. The electron gun 12 may generate the electron beam continuously during a period of the exposure operation because it takes a predetermined time to stably generate the electron beam. The openings of the slit part 16 are preferably formed in accordance with a predetermined opening pattern formed on the mask 30. In FIG. 1, an optical axis of the electron beam emitted from the electron beam irradiation system 110 in a case where it is not deflected by the electron optical system is shown with dashed line A.

The mask projection system 112 has first, second and third deflectors 18, 22 and 26 constituting a mask deflection system for deflecting the electron beam, a second electromagnetic lens 20 as a mask focusing system for adjusting the focus of the electron beam, and a first blanking electrode 24. The first and second deflectors 18 and 22 deflect the electron beam so as to irradiate a predetermined region on the mask 30 with the electron beam. The predetermined region on the mask 30 may be a group of opening patterns containing patterns to be transferred on to the wafer 64, for example The electron beam is shaped to have a cross-sectional shape substantially identical to the opening pattern bypassing through the opening pattern. An image formed by the electron beam after passing through a predetermined opening pattern is defined as a pattern image of that opening pattern. The third deflector 26 deflects the path of the electron beam after passing through the first and second deflectors 18 and 22 to be substantially parallel to the optical path A. The second electromagnetic lens 20 has a function of focusing the image of the opening of the slit part 16 on the mask 30 placed on the mask stage 72.

The first blanking electrode 24 deflects the electron beam so as not to make the electron beam incident on the opening pattern formed on the mask 30. It is preferable that the first blanking electrode 24 deflect the electron beam in such a manner that no region on the mask 30 is irradiated with the electron beam. Since the opening pattern on the mask 30 is deteriorated with the increase of the time in which it is irradiated with the electron beam, the first blanking electrode 24 deflects the electron beam except for a period during which the pattern is being transferred onto the wafer 64. Thus, the deterioration the mask 30 can be prevented. The focus adjusting lens system 114 has third and fourth electromagnetic lenses 28 and 32. The third and fourth electromagnetic lenses 28 and 32 adjust the focusing conditions of the electron beam before and after the electron beam passes through the mask 30.

The wafer projection system 116 includes a fifth electromagnetic lens 40, a sixth electromagnetic lens 46 a seventh electromagnetic lens 50, an eighth electromagnetic lens 52, a ninth electromagnetic lens 66, a fourth deflector 34, a fifth deflector 38, a sixth deflector 42, a main deflector 56, a sub-deflector 58, a second blanking electrode 36 and a round aperture part 48.

The pattern image is inevitably rotated by effects of or a magnetic field. The fifth electromagnetic lens 40 adjusts the rotation amount of the pattern image of the electron beam after passing through a predetermined opening pattern on the mask 30. The sixth and seventh electromagnetic lenses 46 and 50 adjust a reduction ratio of the pattern image transferred onto the wafer 64 with respect to the opening pattern on the mask 30. The eighth and ninth electromagnetic lenses 52 and 66 serve as an objective lens. The fourth and sixth deflectors 34 and 42 deflect the electron beam toward optical axis A at downstream positions of the mask 30 in the traveling direction of the electron beam. The fifth deflector 38 deflects the electron beam to be substantially parallel to optical axis A. The main deflector 56 and the sub-deflector 58 deflect the electron beam so as to be directed to a predetermined region on the wafer 64. In the present embodiment, the main deflector 56 is used in order to deflect the electron beam between sub-fields each containing a plurality of shot areas, each shot area being an area that can be irradiated with one shot of the electron beam. Moreover, the sub-deflector 58 has the deflection amount smaller than that of the main deflector 56 and is used for deflecting the electron beam between the shot areas in each sub-field.

The round aperture part 48 has a circular opening. The second blanking electrode 36 deflects the electron beam so as to be directed to a portion surrounding the circular opening of the round aperture part 48. Therefore, the second blanking electrode 36 can prevent the electron beam from traveling the downstream side of the round aperture part 48 in the traveling direction of the electron beam. Since the electron gun 12 continuously generates the electron beam during the period of the exposure operation, it is desirable that the second blanking electrode 36 deflect the electron beam so as not to allow the electron beam to reach the downstream side of the round aperture part 4B when a pattern to be transferred onto the wafer 64 is changed to another pattern and when a region on the wafer 64 to be exposed is changed.

The controlling system 140 has a general controller 130 and an individual controller 120. The individual controller 120 includes a deflector controller 82, a mask-stage controller 84, a blanking-electrode controller 86, an electromagnetic lens controller 88, a backscattered electron processing unit 90 and a wafer-stage controller 92.

The deflector controller 82 controls the deflection amount and the correction amount of each of the first, second, third, fourth, fifth and sixth deflectors 18, 22, 26, 34, 38 and 42, the main deflector 56 and the sub-deflector 58. The mask-stage controller 84 controls the mask-stage driving unit 68 to move the mask stage 72.

The blanking-electrode controller 86 controls the first and second blanking electrodes 24 and 36. It is desirable to control the first and second blanking electrode 24 and 36 in such a manner that the electron beam is allowed to reach the wafer 64 when the exposure operation is being performed whereas it is not allowed to reach the wafer when the exposure operation is not performed The electromagnetic lens controller 88 controls power supplied to each of the first, second, third, fourth, fifth, sixth, seventh, eighth and ninth electromagnetic lenses 14, 20, 28, 32, 40, 46, 50, 52 and 66. The backscattered electron processing unit 90 obtains digital data indicating the electron amount based on the electric signal obtained by the electron detector 60. The wafer-stage controller 92 controls the wafer-stage driving unit 70 to move the wafer stage 62 to a predetermined position.

The general controller 130 is a workstation, for example, and generally controls the respective controllers and unit in the individual controller 120. The general controller 130 includes a position detector 132, a calculation unit 134 and a memory unit 136.

The position detector 132 receives from the backscattered electron processing unit 90 the digital data that is output from the backscattered electron processing unit 90 in accordance with the backscattered electrons of the electron beam incident on a mark portion provided on the wafer 64. The position detector 132 then detects a relative position of the irradiation position of the electron beam in the mark portion with respect to a reference position in the mark portion based on the received digital data, and outputs the thus detected relative position of the irradiation position with respect to the reference position to the calculation unit 134. The calculation unit 134 obtains a correction equation required for calculating a correction value that corrects the irradiation position of the electron beam based on the relative position of the irradiation position with respect to the reference position that was received from the position detector 132. That is, the calculation unit 134 obtains the correction equation for calculating the correction value that corrects the deflection value by the sub-deflector 58 that is an electrostatic deflector. The correction equation is stored in the memory unit 136. The calculation unit 134 then calculates the correction value at an irradiation position on the wafer 64 to which the electron beam is to be directed, from the correction equation based on that irradiation position, and outputs the calculated correction value to the deflector controller 82 The deflector controller 82 controls a deflection operation of the sub-deflector 58 based on the received correction value, so that the sub-deflector 58 irradiates a desired position on the wafer 64 with the electron beam.

An operation of the electron beam exposure apparatus 100 of the present embodiment is described. The mask 30 which has a plurality of opening patterns containing a predetermined pattern is placed on the mask stage 72 and fixed to a predetermined position. On the wafer stage 62, the wafer 64 which is to be subjected to the exposure operation is placed. The wafer-stage controller 92 moves the wafer stage 62 by the wafer-stage driving unit 70 to transfer an area on the wafer 64 to be exposed to the vicinity of the optical axis A. Moreover, the blanking-electrode controller 86 controls the first and second blanking electrodes 24 and 36 to prevent the mask 30 and the wafer 64 from being irradiated with the electron beam passing through the opening of the slit part 16 before the exposure starts, because the electron gun 12 continuously generates the electron beam during the period of the exposure operation. In the mask projection system 112, the electromagnetic lens 20 and the first, second and third deflectors 18, 22 and 26 are adjusted to allow the electron beam to be incident on the opening pattern of the mask 64 in which the pattern to be transferred onto the wafer 64 is formed. In the focus adjusting lens system 114, the third and fourth electromagnetic lenses 28 and 32 are adjusted to bring the electron beam in focus on the wafer 64. In the wafer projection system 116, the fifth, sixth, seventh, eighth and ninth electromagnetic lenses 40, 46, 50, 52 and 66, the fourth, fifth and sixth deflectors 34, 38 and 42, the main deflector 56 and the sub-deflector 58 are adjusted to allow the transfer of the pattern image onto a predetermined region on the wafer 64.

After the mask projection system 112, the focus adjusting system 114 and the wafer projection system 116 have been adjusted, the blanking-electrode controller 86 stops the deflection by each of the first and second blanking electrodes 24 and 36, thereby, allowing the electron beam to reach the wafer 64 via the mask 30 in the following manner Next, the electron beam exposure apparatus 100 of the present embodiment obtains the correction equation for calculating the correction value used in the correction of the deflection amount by the sub-deflector 58. After obtaining the correction equation, the electron beam exposure apparatus 100 calculates the correction value used for correcting the deflection amount by the sub-deflector 58 based on the obtained correction equation and the irradiation position which is to be irradiated with the electron beam, and then performs the exposure operation for the wafer 64 placed on the wafer stage 62.

First, the electron gun 12 generates the electron beam. The first electromagnetic lens 14 adjusts the focus of the electron beam and makes the electron beam incident on the slit part 16. The first and second deflectors 18 and 22 then deflect the electron beam that has passed through the opening of the slit part 16 so that the electron beam is directed onto a predetermined region on the mask 30 where the pattern to be transferred is formed. The electron beam after passing through the opening of the slit part 16 has a rectangular cross-sectional shape. The electron beam deflected by the first and second deflectors 18 and 22 is further deflected by the third deflector 26 so as to be substantially parallel to the optical axis A. Moreover, the electron beam is adjusted by the second electromagnetic lens 20 to form an image of the opening of the slit part 16 on the predetermined region on the mask 30.

The electron beam that has passed through the opening pattern formed on the mask 30 is deflected by the fourth and sixth deflectors 34 and 42 toward optical axis A, and is further deflected by the fifth deflector 38 to be substantially parallel to optical axis A. Moreover, the electron beam is adjusted by the third and fourth electromagnetic lenses 28 and 32 so that the image of the opening pattern formed on the mask 30 is in focus on a surface of the wafer 64. The rotation amount of the pattern image is adjusted by the fifth electromagnetic lens 40, and the reduction ratio of the pattern image is adjusted by the sixth and seventh electromagnetic lenses 46 and 50. Then, the electron beam is deflected by the main deflector 56 and the sub-deflector 58 to be directed to a predetermined shot area on the wafer 64. In the present embodiment, the main deflector 56 deflects the electron beam between the sub-fields each containing a plurality of shot areas while the sub-deflector 58 deflects it between the shot areas in each sub-field. The electron beam that is deflected to be directed to the predetermined shot area is adjusted by the electromagnetic lenses 52 and 66, so that it is incident on the wafer 64. Thus, the image of the opening pattern formed on the mask 30 is transferred onto the predetermined shot area on the wafer 64.

After a predetermined exposure time has passed, the blanking-electrode controller 86 controls the first and second blanking electrodes 24 and 36 to deflect the electron beam in such a manner that the electron beam is not incident on the mask 30 and the wafer 64. By performing the above processes, a pattern having the shape of the opening pattern formed on the mask 30 is transferred by exposure on a predetermined shot area of the wafer 64. Then, in order to transfer the pattern having the shape of the opening pattern formed on the mask 30 onto the next shot area by exposure, the second electromagnetic lens 20, the first deflector 18, the second deflector 22 and the third deflector 26 in the mask projection system 112 are adjusted to allow the electron beam to be incident on the opening pattern having the pattern to be transferred onto the wafer 64. Also, in the focus adjusting lens system 114, the third and fourth electromagnetic lenses 28 and 32 are adjusted to make the electron beam in focus on the wafer 64. Moreover, in the wafer projection system 116, the fifth, sixth, seventh, eighth and ninth electromagnetic lenses 40, 46, 50, 52 and 66, the fourth, fifth and sixth deflectors 34, 38 and 42, the main deflector 56 and the sub-deflector 58 are adjusted to enable the pattern image to be transferred onto a predetermined region on the wafer 64.

More specifically, in the sub-deflector 58, the electric field is adjusted in such a manner that the pattern image generated by the mask projection system 112 is transferred by exposure onto the next shot area. After the adjustment of the electric field of the sub-detector 58, the pattern is exposed in that next shot area in the aforementioned manner. After the pattern is exposed in all the shot areas in the sub-field where the pattern is to be exposed, the main deflector 56 adjusts its magnetic field so as to allow the pattern to be transferred by exposure onto the next sub-field. The electron beam exposure apparatus 100 can transfer a desired circuit pattern by exposure onto the wafer 64 by repeating the aforementioned exposure operation.

The electron beam exposure apparatus 100 of the present invention may be an electron beam exposure apparatus using a variable shape or an electron beam exposure apparatus using a blanking aperture array device Moreover, the electron beam exposure apparatus of the present invention may be a multi-beam exposure apparatus using a plurality of electron beams for transferring a pattern onto the wafer by exposure.

According to the electron beam exposure apparatus of the present embodiment, the deflection amount of the electron beam can be corrected in accordance with a magnetic field formed by the magnetic material of the wafer, a distribution of the magnetic material on/in the wafer, the magnetic fields formed by the electromagnetic lenses, the shape of the wafer having the magnetic material and the like. Thus, the electron beam exposure apparatus of the present embodiment can expose the wafer having the magnetic material with high precision.

Figure 2:
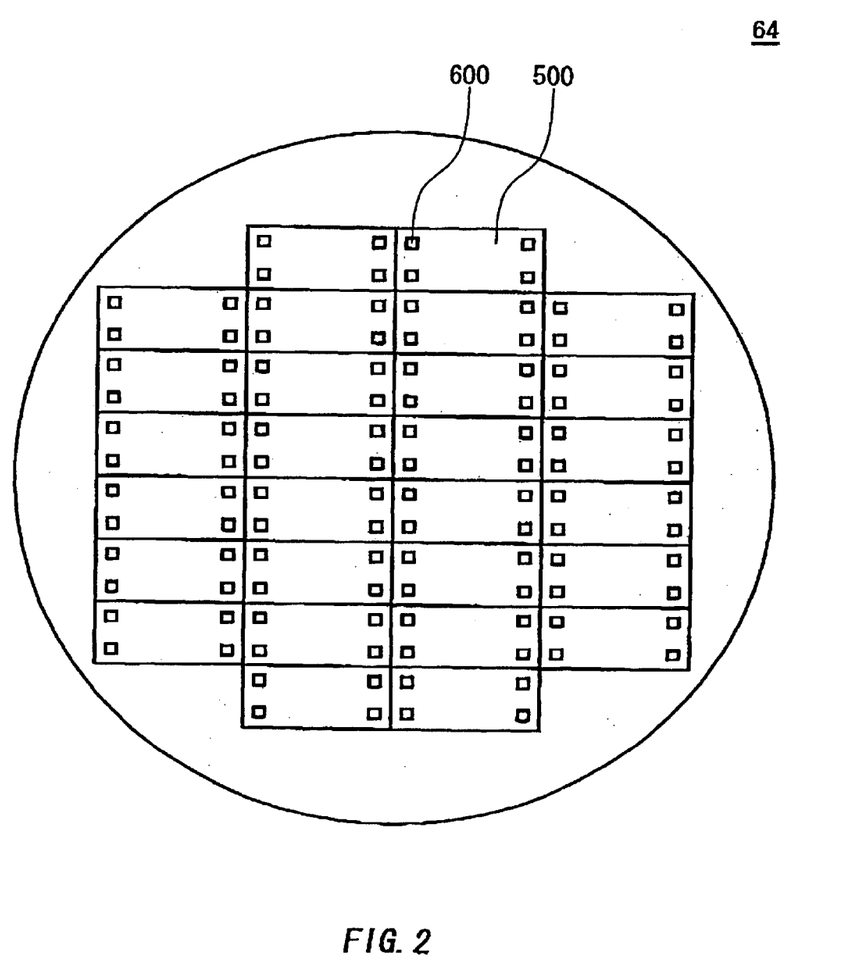
FIG. 2 shows a top view of wafer.

FIG. 2 shows a top view of the wafer 64. The wafer 64 has a plurality of regions 500 (500-1, 500-2, . . . ). The regions 500 are regions where electronic devices are to be formed on the wafer 64. Each region 500 may contain a single electronic device or a plurality of electronic devices. Moreover, the regions 500 may be regions that can be exposed by one shot of exposure by means of an exposure apparatus that exposes the wafer by using ultraviolet light, for example.

The regions 500 respectively have a plurality of mark portions 600 (600-1, 600-2, . . . ). The mark portions 600 may be formed under the magnetic material parts formed on/in the wafer 64 or in the same layer as the magnetic material parts, The mark portions 600 are preferably formed at respective corners of the corresponding regions 500.

The mark portions 600 are formed in advance in the corresponding regions 500 by exposing resist applied on the wafer 64, for example, by means of an exposure apparatus for exposing the wafer using ultraviolet light. For example, the mark portions 600 are formed in the corresponding regions 500 by exposing a predetermined region 500 and then moving the wafer 64 so as to expose another region 500.

Figure 3:
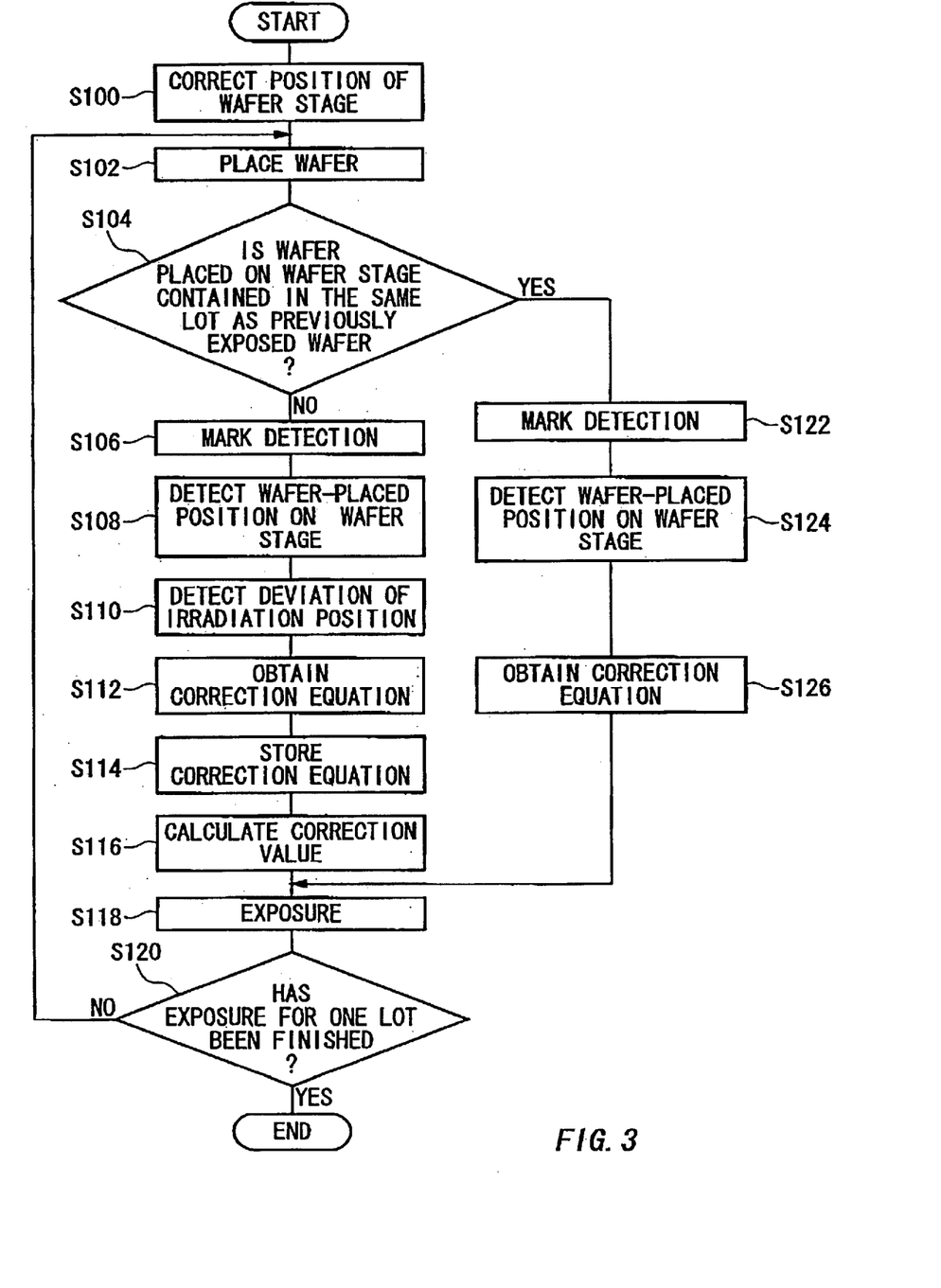
FIG. 3 is an exemplary flowchart of an exposure method according to an embodiment of the present invention.

FIG. 3 is an exemplary flowchart of an exposure method according to the present embodiment. First, a position of the wafer stage 62 on which a wafer is to be placed is corrected (Step S100) Then, a wafer having magnetic material is carried in and placed on the wafer stage 62 for which the position has been corrected (Step S102). On the wafer 64, the mark portions 600 are formed in advance in the corresponding regions 500 by means of an exposure apparatus for exposing the wafer, for example, by using ultraviolet light. For example, the wafer 64 has a layer of the magnetic material formed thereon.

The general controller 130 determines whether or not the wafer that is placed on the wafer stage 62 in Step S102 has identical characteristics to those of the wafer previously exposed. For example, this determination is performed by determining whether or not the wafer placed on the wafer stage 62 in Step S102 is contained in the same lot as the previously exposed wafer (Step S104). Please note that "the same lot" means a group of wafer pieces that were processed in one sequence in another apparatus such as an exposure apparatus that exposes wafer by using ultraviolet light.

In a case where it is determined in Step S104 that the wafer placed on the wafer stage 62 is not contained in the same lot as the previously exposed wafer, an electron beam is made incident on a plurality of mark portions formed to be distributed over the wafer, thereby performing mark detection (Step S106). Thus, positions of the respective mark portions 600 in the wafer 64 are detected. The mark portions 600 in a predetermined region 500 of the wafer 64 are preferably formed in a layer under a layer to be exposed by this exposure method by deposition, exposure and etching. Moreover, the mark portions may be formed by exposure by means of the electron beam exposure apparatus 100 or another exposure apparatus such as a light exposure apparatus.

By detecting the positions of the mark portions 600 formed in the predetermined regions 500 in the wafer 64, deviations, rotations and the like of the mark portions 600 in the wafer 64 can be detected. This detection enables a position on the wafer 64 on which the electron beam is to be incident to be determined with high precision.

Next, the position detector 132 detects a position on the wafer state 62, at which the wafer is placed, based on the result of the mark detection in Step S106 (Step S108). For example, the position detector 132 detects the wafer-placed position on the wafer stage 62 based on a relative position of the stage position of the wafer stage 62 and the detected positions of the mark portions formed on the wafer.

The position detector 132 also detects a deviation of an irradiation position of the electron beam, that is caused by the effect of the magnetic property of the magnetic material of the wafer, based on the result of the mark detection in Step S106 (Step S110). Moreover, the position detector 132 detects a deviation of the irradiation position of the electron beam that is caused by a magnetic material part or wiring in the underlying layer of the wafer or a fabrication error of the magnetic material part or wiring in that underlying layer based on the result of the mark detection in Step S106 (Step S110). The fabrication error contains rotation and expansion of electronic devices formed on/in the wafer and distortion caused by another exposure apparatus.

The calculation unit 134 obtains the correction equation for calculating the irradiation correction value that corrects the deflection amount of the electron beam by the sub-deflector 58 based on the wafer-placed position, the deviation of the irradiation position caused by the effect of the magnetic property of the magnetic material of the wafer, and the deviation of the irradiation position caused by the fabrication error of the underlying wiring which were detected by the position detector 132 (Step S112). Then, the memory unit 136 stores the correction equation obtained by the calculation unit 134.

More specifically, the deviation of the irradiation position caused by the effect of the magnetic property of the magnetic material of the wafer is caused by the magnetic field formed by the magnetic material of the wafer, the distribution of the magnetic material on/in the wafer, the magnetic fields formed by the eighth and ninth electromagnetic lenses 52 and 66 arranged near the wafer for forming the magnetic fields surrounding the wafer, the shape of the wafer having the magnetic material, and the like. Therefore, the calculation unit 134 obtains the correction equation for calculating the irradiation correction value that corrects of the deflection amount of the electron beam by the sub-deflector 58 based on the magnetic field formed by the magnetic material of the wafer, the distribution of the magnetic material on/in the wafer, the magnetic fields formed by the eighth and ninth electromagnetic lenses 52 and 66 and the shape of the wafer having the magnetic material. The calculation unit 134 also obtains the correction equation for calculating the irradiation correction value that corrects the deflection amount of the electron beam by the sub-deflector 58 based on a positional relationship between the magnetic fields formed by the eighth and ninth electromagnetic lenses 52 and 66 and the wafer having the magnetic material. This positional relationship may be a positional relationship in a moving direction of the wafer or in a traveling direction of the electron beam. Moreover, the calculation unit 134 may obtain the correction equation for calculating the irradiation correction value used in the correction of the electron beam by the sub-deflector 58 further based on the magnetic fields formed by the first, second, third, fourth, fifth, sixth and seventh electromagnetic lenses 14, 20, 28, 32, 40, 46 and 50.

It is preferable that the correction equation obtained by the calculation unit 134 be a single polynomial that can provide the irradiation correction value that corrects the deflection amount by the sub-deflector 58 based on a plurality of irradiation positions of the electron beam on the wafer. Moreover, the calculation unit 134 preferably obtains the correction equation by least square approximation based on the distribution of the deviations of the irradiation positions of the electron beam on the wafer. Furthermore, it is preferable that the correction equation obtained by the calculation unit 134 be a polynomial of the fifth degree or more.

The calculation unit 134 may obtain the correction equation further based on the fabrication error occurred in the formation of the mark portions 600 and the like in the wafer 64, for example. More specifically, the calculation unit 134 obtains the correction equation by removing, in each region 500, the fabrication error occurred in the formation of the mark portions 600 and the like in the wafer 64, for example, from the deviation of the irradiation position of the electron beam caused by the effect of the magnetic material formed with a predetermined density on/in the wafer 64. In other words, the calculation unit 134 obtains the correction equation that corrects the deviation of the irradiation position of the electron beam only based on the effect of the magnetic material of the wafer 64. The fabrication error mentioned above are, for example, a fabrication error caused by the difference between the movements of the wafer stage of the exposure apparatus used in the formation of the mark portions 600, or the like.

In this case, it is preferable that the calculation unit 134 obtain a region correction value for each region 500 that corrects the deviation of the irradiation position of the electron beam, the correction value being calculated based on the fabrication error in each region 500. More specifically, the calculation unit 134 calculates the region correction values based on relative positional deviations between a plurality of regions 500. The calculation unit 134 calculates the relative positional deviations between the regions 500 based on the relative positions of the mark portions 600 formed in the respective regions 500, for example. The memory unit 136 then store the region correction values in such a manner that the region correction values correspond to the associated regions 500, respectively.

The calculation unit 134 may obtain the correction equation while assuming the relative positional deviations of a plurality of mark portions 600 in one region 500 to be the aforementioned fabrication error. This fabrication error is a fabrication error based on lens aberration in the exposure apparatus used in the formation of the mark portions 600, for example. Also in this case, it is preferable that the calculation unit 134 calculates the region correction value for each region 500 for correcting the irradiation position of the electron beam, that is calculated based on the fabrication error in each region 500. The memory unit 136 then stores the region correction values so as to correspond to the associated regions 500, respectively.

In a case where it is determined in Step S104 that the wafer placed on the wafer stage 62 is contained in the same lot as the previously exposed wafer, the mark detection is performed by irradiating a part of a plurality of mark portions on the wafer with the electron beam (Step S122). The position detector 132 then detects the wafer-placed position on the wafer stage 62 based on the result of the mark detection in Step S122 (Step S124) The calculation unit 134 then obtains a correction equation for calculating the irradiation correction value used in the correction of the deflection amount of the electron beam by the sub-deflector 58 based on the wafer-placed position detected by the position detector 132 and the correction equation stored in the memory unit 136 (Step S126) In other words, the calculation unit 134 obtains a new correction equation for the presently exposed wafer based on the wafer-placed position of the previously exposed wafer on the wafer stage 62, the wafer-placed position of the presently exposed wafer on the wafer stage 62 and the correction equation obtained for the previously exposed wafer.

Next, based on an irradiation position on which the electron beam is to be incident, the calculation unit 134 obtains the irradiation correction value that corrects the deflection amount by the sub-deflector 58 at that irradiation position from the thus obtained correction equation (Step S116). It is preferable that the calculation unit 134 calculates the irradiation correction value based on a relative position of a position of a predetermined mark portion 600 on the wafer 64 and the irradiation position on which the electron beam is to be incident. The deflector controller 82 then controls the sub-deflector 58 based on the correction value calculated by the calculation unit 134. Then, the sub-deflector 58 deflects the electron beam in accordance with the control by the deflector controller 82 so as to make the electron beam incident on a desired position on the wafer, thereby exposing the desired position on the wafer (Step 118).

The calculation unit 134 may calculate the irradiation correction value further based on the region correction value stored in the memory unit 136 to correspond to the associated region 500. That is, the calculation unit 134 calculates their radiation correction value based on the deviation of the irradiation position of the electron beam caused by the effect of the magnetic material part formed on/in the wafer and the deviation of the irradiation position of the electron beam caused by the fabrication error of the mark portions 600 or the like in each region 500, in accordance with the correction equation. Such calculation can improve the precision of irradiation of the wafer with the electron beam.

Then, the wafer placed on the wafer stage 62 is carried out, and the general controller 130 determines whether or not all of a predetermined number of plates of a wafer have been exposed. That is, the general controller 130 determines whether or not the exposure for one lot of the wafer has been finished (Step S120). In a case where it is determined in Step S120 that the exposure for one lot of the wafer has not been finished yet, the flow goes back to Step S102, and the next wafer is placed on the wafer stage 62. In another case where it is determined in Step S120 that the exposure for one lot of the wafer has been finished, the flow of the exposure method of the present embodiment is finished.

According to the exposure method of the present embodiment, the deflection amount of the electron beam can be corrected based on the magnetic field formed by the magnetic material of the wafer, the distribution of the magnetic material on/in the wafer, the magnetic fields formed by the electromagnetic lenses, the shape of the wafer having the magnetic material, and the like. Thus, the wafer having the magnetic material can be exposed with high precision.

Moreover, a plurality of plates of a wafer in the same lot have substantially the same deviation of the irradiation position caused by the effect of the magnetic property of the magnetic material of the wafer and caused by the formation error of the underlying lines because they are fabricated by the same fabrication process. Thus, by updating the correction equation using the difference between the wafer-placed positions on the wafer stage 62, the same correction equation can be used. Therefore, a time period required for obtaining the correction equation can be reduced, thereby reducing the time period required for the exposure operation of the wafer.

Figure 4:
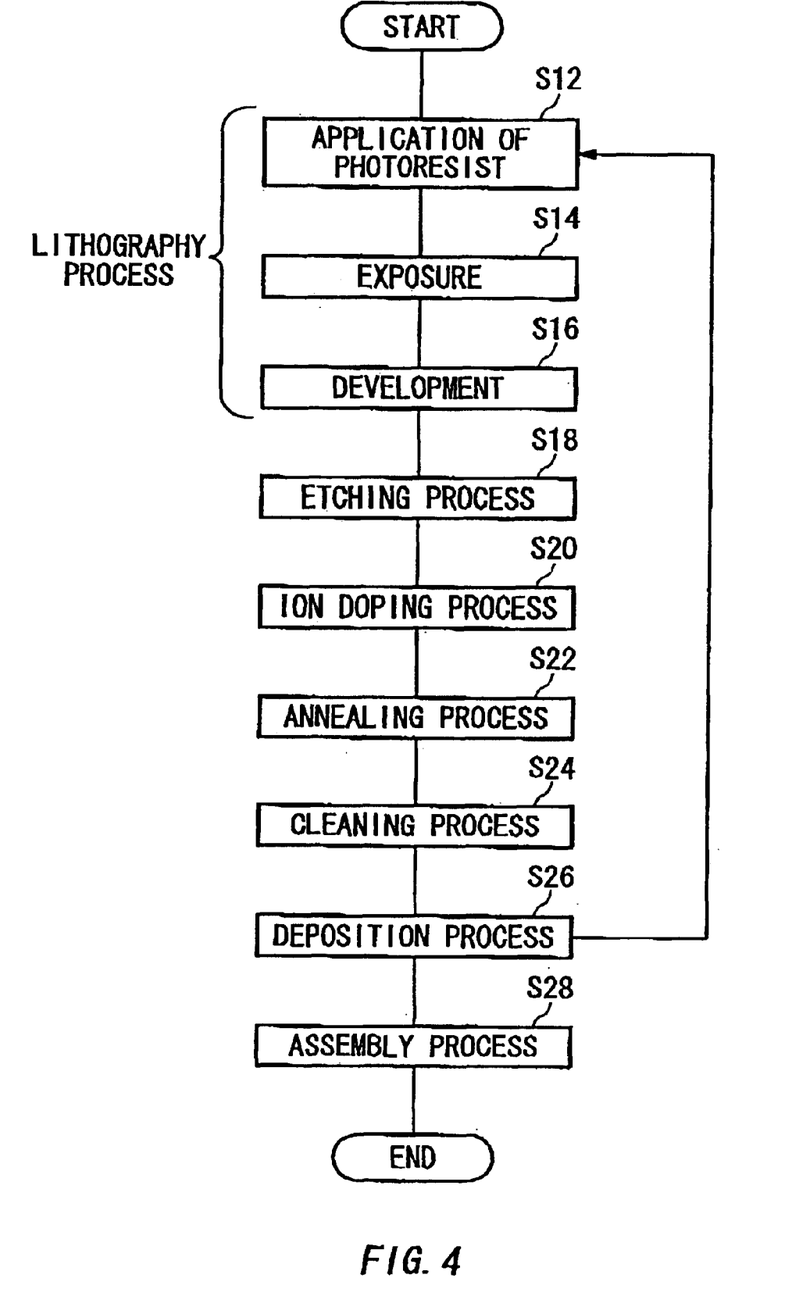
FIG. 4 is an exemplary flowchart of a fabrication method of an electronic device according to an embodiment of the present invention.

FIG. 4 is an exemplary flowchart of a fabrication method of an electronic device according to an embodiment of the present invention. The electronic device is, for example, a magnetic head, a magnetic memory device such as an MRAM, or a semiconductor device with super conductive material.

First, photoresist is applied onto an upper surface of the wafer (Step S12). The wafer with the photoresist applied thereon is placed on the wafer stage 62 in the electron beam exposure apparatus 100. On the wafer, the pattern image is transferred by exposure using the electron beam in the manner mentioned referring to FIGS. 1, 2 and 3 (Step S14).

The exposed wafer is immersed in developing solution to be developed, thereby unnecessary resist is removed (Step S16). Silicon substrate, an insulation film or a conductive film that exists in a region where the photoresist on the wafer is removed is then etched by anisotropic etching using plasma (Step S18). Then, impurities such as boron or arsenic ions are doped into the wafer in order to form the semiconductor device such as a transistor or diode (Step S20). After doping, the wafer is annealed to activate the impurities (Step S22). Then, in order to remove organic contaminants or metal contaminants on the wafer, the wafer is cleaned in chemical solution (Step S24). On the wafer that has been cleaned, a conductive film or an insulation film is formed, so that a wiring layer and an insulation layer between the wirings are formed (Step S26). By combining Steps S12 to S26 and performing these steps in a repeating manner, the electronic device having a part-isolation region, a part region and the wiring layer is fabricated on the wafer. Then, the wafer having required circuits is cut into pieces and the pieces respectively having the circuits are assembled (Step S28), thereby finishing the flow of the fabrication method of the electronic device of the present embodiment.

According to the fabrication method of the electronic device of the present embodiment, the wafer having the magnetic material can be exposed with high precision by the electron beam exposure apparatus 100 and therefore the fine electronic device can be fabricated.

As is apparent from the above, according to the present invention, the exposure method which corrects the irradiation position of the electron beam and therefore exposes the wafer with high precision can be provided.

Although the present invention has been described by way of exemplary embodiments, it should be understood that those skilled in the art might make many changes and substitutions without departing from the spirit and the scope of the present invention which is defined only by the appended claims.

What is claimed is:

1. An exposure method for exposing a wafer having magnetic material by using an electron beam, comprising:

placing the wafer on a wafer stage;

detecting a reference location provided on the wafer;

exposing the wafer to the electron beam;

detecting a reflected location at where the electron beam is reflected from the wafer;

calculating a correction value based on said reference location and said reflected location for correcting a displacement of said reflected location due to a magnetic field of the magnetic material; and deflecting said electron beam based on said correction value.

2. An exposure method as claimed in claim 1, wherein said calculation calculates said correction value further based on a distribution of said magnetic material on said wafer.

3. An exposure method as claimed in claim 1, wherein said calculation calculates said correction value further based on a wafer-placed position on said wafer stage at which said wafer is placed.

4. An exposure method as claimed in claim 1, wherein said calculation calculates said correction value further based on a positional relationship between said wafer and a magnetic field formed by an electromagnetic lens for converging said electron beam.

5. An exposure method as claimed in claim 4, wherein said calculation calculates said correction value based on said positional relationship between said wafer and said electromagnetic lens serving as an objective lens.

6. An exposure method as claimed in claim 1, wherein said calculation calculates said correction value further based on a shape of said wafer.

7. An exposure method as claimed in claim 1, further comprising correcting a stage-position that is a position of said wafer stage, wherein said calculation calculates said correction value based on said irradiation position on said wafer placed on said wafer stage for which said stage-position has been corrected.

8. An exposure method as claimed in claim 1, further comprising forming a mark portion on said wafer, wherein said calculation calculates said correction value further based on a positional relationship between said mark portion and said irradiation position on said wafer.

9. An exposure method as claimed in claim 1, further comprising:

placing another wafer on said wafer stage;

correcting another correction value that corrects said deflection amount by said deflector based on a positional relationship between said wafer-placed position of said wafer on said wafer stage and another wafer-placed position of said other wafer on said wafer stag, and said correction value for said wafer; and deflecting said electron beam based on said another correction value to expose said other wafer.

10. An electron beam exposure apparatus for exposing a wafer having magnetic material by using an electron beam, comprising:

a wafer stage on which the wafer is to be placed;

an exposure unit operable to expose the wafer to the electron beam;

a detector unit operable to detect a reference location provided on the wafer and a reflected location at where the electron beam is reflected from the wafer;

a calculation unit operable to calculate a correction value based on said reference location and said reflected location for correcting a displacement of said reflected location due to a magnetic field of the magnetic material; and a deflector operable to deflect the electron beam based on said correction value.

11. An electron beam exposure apparatus as claimed in claim 10, further comprising an electromagnetic lens operable to form a magnetic field to converge said electron beam, wherein said calculation unit calculates said correction value further based on a positional relationship between said wafer and said magnetic field formed by said electromagnetic lens.

12. An electron beam exposure apparatus as claimed in claim 11, wherein said electromagnetic lens serves as an objective lens.

13. A fabrication method of an electronic device by exposing a wafer having magnetic material by using an electromagnetic lens, comprising:

placing the wafer on a wafer stage;

detecting a reference location provided on the wafer;

exposing the wafer to an electron beam;

detecting a reflected location at where the electron beam is reflected from the wafer;

calculating a correction value based on said reference location and said reflected location for correcting a displacement of said reflected location due to a magnetic field of the magnetic material; and deflecting said electron beam based on said correction value.

14. A fabrication method of an electronic device as claimed in claim 13, further comprising forming a mark portion including at least a first mark portion in a first region in said wafer, wherein said placing of said wafer places said wafer with said first mark portion therein on said wafer stage, and said calculation calculates said correction value further based on a position of said first mark portion in said wafer.

15. A fabrication method of an electronic device as claimed in claim 14, further comprising:

storing said correction value in said first region;

placing another wafer having magnetic material on said wafer stage; and irradiating said first region in said wafer with said electron beam based on said stored correction value in said first region and a position of said other wafer on said wafer stage.

16. A fabrication method of an electronic device as claimed in claim 14, wherein said formation of said mark portion includes:

applying resist on said wafer;

exposing said resist by irradiating said first region with light to form said first mark portion in said first region; and exposing said resist by irradiating a second region in said wafer with light to form a second mark portion in said second region, wherein said calculation calculates said correction value in said first region further based on said position of said first region and calculates said correction value in said second region further based on a position of said second region, and wherein, in said exposure of said wafer, said electron beam is deflected based on said correction value in said first region in a case where said first region is irradiated with said electron beam, and is deflected based on said correction value in said second region in a case where said second region is irradiated with said electron beam.

17. A fabrication method of an electronic device as claimed in claim 16, wherein said formation of said mark portion includes forming a plurality of first mark portions in said first region and forming a plurality of second mark portions in said second region, and said calculation calculates said correction value in said first region further based on relative positions of said first mark portions and calculates said correction value in said second region further based on relative positions of said second mark portions.

* * * * *